US010450677B2

(12) United States Patent
Chou et al.

(10) Patent No.: US 10,450,677 B2
(45) Date of Patent: Oct. 22, 2019

(54) METHOD TO MANUFACTURE MICROFIBERS AND MICROCAPILLARIES

(71) Applicant: California Institute of Technology, Pasadena, CA (US)

(72) Inventors: Tzu-Chieh Chou, Pasadena, CA (US); Yu-Chong Tai, Pasadena, CA (US); Yudan Pi, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 16/250,963

(22) Filed: Jan. 17, 2019

(65) Prior Publication Data

US 2019/0218687 A1 Jul. 18, 2019

Related U.S. Application Data

(60) Provisional application No. 62/618,818, filed on Jan. 18, 2018.

(51) Int. Cl.
  *D01F 6/96* (2006.01)
  *D01D 10/02* (2006.01)
  *D01D 5/24* (2006.01)

(52) U.S. Cl.
  CPC .......... *D01F 6/96* (2013.01); *D01D 5/24* (2013.01); *D01D 10/02* (2013.01)

(58) Field of Classification Search
  CPC .......... D01F 6/96; D01D 10/02; D01D 5/24
  See application file for complete search history.

(56) References Cited

U.S. PATENT DOCUMENTS

| 2003/0012866 A1 | 1/2003 | Harnett et al. |
| 2013/0297019 A1 | 11/2013 | Tai et al. |
| 2014/0255270 A1 | 9/2014 | Satsanarukkit et al. |
| 2016/0039121 A1 | 2/2016 | Jiang et al. |

FOREIGN PATENT DOCUMENTS

CN        107474225        12/2017

OTHER PUBLICATIONS

Berry et al., Characterization and Modeling of Direct-Write Fabrication of Microscale Polymer Fibers, Polymer, vol. 52, No. 7, Mar. 23, 2011, pp. 1654-1661.

(Continued)

*Primary Examiner* — Michael C Miggins
(74) *Attorney, Agent, or Firm* — Kilpatrick, Townsend & Stockton LLP

(57) ABSTRACT

A parylene microcapillary is manufactured by drawing a polyethylene carbonate (PEC) fiber from a 0° C. solution of 12-25% PEC in chloroform to create a PEC fiber that has a constant diameter over several centimeters. Parylene is deposited in a chamber over the PEC fiber, and then the coated PEC fiber is heated above 180° C. This heating melts and decomposes the PEC fiber such that it self-expels from the coating, leaving a microcapillary. The self-expulsion allows for meters-long lengths of microcapillaries. Alternatively, a serpentine fiber channel of PEC is created by deposition, photolithography, and etching within a sandwich of parylene. It is heated above 180° C. to expel the PEC leaving a hollow channel within a mass of parylene. The resulting microcapillaries may have residues of cyclic ethylene carbonate remaining from the decomposed PEC.

16 Claims, 9 Drawing Sheets

(56) References Cited

OTHER PUBLICATIONS

Berry et al., Characterization of Micromanipulator-controlled Dry Spinning of Micro- and Sub-Microscale Polymer Fibers, J. Micromech. Microeng., vol. 16, No. 9, Jul. 28, 2006, pp. 1825-1832.

Harfenist et al., Direct Drawing of Suspended Filamentary Micro- and Nanostructures from Liquid Polymers, Nano Letters, vol. 4, No. 10, Sep. 3, 2004, pp. 1931-1937.

Huang et al., A Review on Polymer Nanofibers by Electrospinning and their Applications in Nanocomposites, Composites Science and Technology, vol. 63, No. 15, Nov. 2003, pp. 2223-2253.

Nain et al., Drawing Suspended Polymer Micro-/nanofibers Using Glass Micropipettes, Applied Physics Letters, vol. 89, No. 18, Oct. 31, 2006, pp. 183105-1-183105-3.

Phillips et al., Thermal Decomposition of Poly(Propylene Carbonate): End-capping, Additives, and Solvent Effects, Polymer Degradation and Stability, vol. 125, Mar. 2016, pp. 129-139.

Tripathi et al., Using Filament Stretching Rheometry to Predict Strand Formation and "Processability" in Adhesives and Other Non-Newtonian Fluids, Rheologica Acta, vol. 39, No. 4, Aug. 2000, pp. 321-337.

Feng et al., "Universal Concept for Fabricating Micron to Millimeter Sized 3-D Parylene Structures on Rigid and Flexible Substrates", Published in: The Sixteenth Annual International Conference on Micro Electro Mechanical Systems, MEMS-03 Kyoto, IEEE, Apr. 2, 2003, pp. 594-597.

PCT/US2019/014065, "International Search Report and Written Opinion Received," dated Apr. 8, 2019, 11 pages.

Harfenist et al., "Direct drawing of suspended filamentary micro- and nanostructures from liquid polymers." Nano Letters, vol. 4, pp. 1931-1937, 2004.

Anubhar Tripathi, P. Whittingstall, and Gareth H. McKinley, "Using filament stretching rheometry to predict strand formation and 'processability' in adhesives and other non-Newtonian fluids" Rheologica Acta, vol. 39, pp. 321-337, 2000.

METHOD TO MANUFACTURE MICROFIBERS AND MICROCAPILLARIES

CROSS-REFERENCES TO RELATED APPLICATIONS

This application claims the benefit of U.S. Provisional Application No. 62/618,818, filed Jan. 18, 2018, the contents of which are incorporated by reference in their entirety for all purposes.

STATEMENT AS TO RIGHTS TO INVENTIONS MADE UNDER FEDERALLY SPONSORED RESEARCH AND DEVELOPMENT

Not Applicable

BACKGROUND

1. Field of the Art

Embodiments of the present invention generally related to the manufacture of small diameter polymer capillaries, including 1-100 μm diameter capillaries made from biocompatible parylene with lengths that can exceed a meter.

2. Description of the Related Art

Small diameter capillaries are difficult to manufacture. Standard commercial techniques can reach capillary diameters down to about 80 microns (μm), and thus such capillaries are available on the market. However, smaller diameters are noticeably absent for centimeter-long lengths.

Some have attempted making small diameter capillaries by chemically etching a fiber from within. However, chemical etching only works from the exposed ends, and the etching time is quadratically proportional to the fiber length. Thus, it takes a long time to etch such fibers, and commercial manufacturing is unrealistic for capillaries more than a few millimeters in length.

In Steven A. Harfenist et al., "Direct drawing of suspended filamentary micro- and nanostructures from liquid polymers." *Nano Letters*, vol. 4, pp. 1931-1937, 2004, attempts at making 50 nm to 20 μm fibers are reviewed. Fibers are drawn by an atomic force microscope (AFM) tip from a first polymer droplet to a second drop to form a polymer bridge between the droplets. Vapor deposition of parylene, metal, or glass is performed, and then the polymer is dissolved, leaving a capillary made of the deposited material. The length of the polymer bridge is limited by its static strength against gravity. The authors attempt to make longer fibers by drawing polymer bridges between multiple droplets in a row. This leads to the design of a bed of nails-like array of sharp tips to support each droplet and the requirement to place each droplet on each sharp tip. Because each polymer bridge bends under its own weight in the shape of a catenary, the resulting capillary will have catenary-shaped sections.

Further, keeping a constant inner diameter of the capillary is an issue. The inner diameter of the capillary follows the diameter of the sacrificial fiber, and so it is important for a sacrificial fiber to be a constant diameter. Drawn fibers may have uniform diameters along their lengths but are typically less than 2 centimeters (cm) long. Electrospinning can produce 10 nm to 1 μm fibers, but elecrospun microfiber uniformity is difficult to control.

There is a need in the art for methods to manufacture small diameter capillaries of long lengths.

BRIEF SUMMARY

Generally, a microcapillary is manufactured by drawing a sacrificial polyethylene carbonate (PEC) fiber from a 12-25% PEC-to-chloroform solution at 0° C., allowing it to harden, depositing a thin layer of parylene over the fiber, and then heating it above 180° C. to expel the PEC. The heating decomposes some of the PEC, turning it to a gas that helps to force out molten PEC quickly from the ends. This allows tiny microcapillaries to be created in centimeter and meter-long lengths.

Microcapillaries can also be manufactured by depositing and etching such that there is a serpentine PEC fiber channel within parylene with at least one end of the PEC fiber exposed. It is then heated above 180° C. to expel the PEC. Like in the embodiment above, the heating creates conditions that rapidly push molten PEC out of the exposed end(s), leaving parylene with a hollow serpentine channel.

The resulting microcapillaries may contain residue of cyclic ethylene carbonate left over from the almost, but not complete, decomposition of the PEC.

Some embodiments of the present invention are related to a method of manufacturing a biocompatible capillary. Polyethylene carbonate (PEC) is dissolved in chloroform to create a liquid solution with a mass fraction of 12% to 25% PEC to chloroform. The method includes drawing a PEC fiber by contacting a point with the liquid solution, pulling the point away from the solution, and allowing the chloroform to evaporate to solidify the drawn PEC fiber, depositing parylene by chemical vapor deposition on the PEC fiber to coat the PEC fiber, heating the coated PEC fiber to a temperature between 180° C. and a melting point of the parylene, thereby melting the PEC and partially decomposing the PEC into gaseous carbon dioxide, such that the gaseous carbon dioxide pushes the molten PEC out of at least one end of the coated PEC fiber to leave a hollow parylene capillary.

The method can further include cooling the solution to 0° C. before the pulling. The pulling of the point can be performed at a constant velocity. The point can be an end of a cylinder, such as a glass tube that is 762 μm in diameter. The constant velocity can be between 13 millimeters (mm) per minute to 1100 mm/minute. The coated PEC fiber can be heated to a temperature between 180° C. and 260° C. The PEC fiber is drawn to a length greater than 50 millimeters (mm) or 300 mm.

The method can include coiling or serpentining the PEC fiber before placing the PEC fiber in a deposition chamber for the deposition. It can further include stretching the hollow parylene capillary over a form, and heating the stretched hollow parylene capillary to a temperature above 200° C. in order to mechanically relax and re-form the hollow parylene capillary. The depositing can result in a parylene wall thickness between 0.1 μm and 100 μm. The parylene can be selected from the group consisting of parylene N, parylene C, parylene D, parylene HT, parylene AF-4, and parylene F.

Some embodiments are related to a method of manufacturing a biocompatible capillary, the method including depositing parylene on a substrate, coating the parylene with polyethylene carbonate (PEC), etching the PEC to create a coiled or serpentine fiber of PEC on top of parylene, depositing parylene over the PEC fiber to form a coated PEC fiber, and heating the coated PEC fiber to a temperature between 180° C. and a melting point of the parylene, thereby melting the PEC and partially decomposing the PEC into gaseous carbon dioxide, such that the gaseous carbon dioxide pushes the molten PEC out of at least one end of the coated PEC fiber to leave a hollow parylene capillary.

The coated PEC fiber can be heated to a temperature between 180° C. and 260° C. The etching can create a serpentine fiber of PEC, wherein the hollow parylene capillary has periodic U-shaped sections along its length. The method can further include stretching the hollow parylene capillary over a form, and heating the stretched hollow parylene capillary to a temperature above 200° C. in order to mechanically relax and re-form the hollow parylene capillary.

Some embodiments are related to a lithographically manufactured biocompatible capillary apparatus, including a puck or other mass of parylene with a rectangular cross section lumen have a width of 1 µm to 100 µm, a top or bottom wall thickness between 0.1 µm and 100 µm, and a length greater than 30 centimeters, where the tube has periodic U-shaped sections along its length.

The apparatus can include residue inside the lumen comprising cyclic ethylene carbonate.

Some embodiments are related to a thin-walled, biocompatible capillary apparatus including a hollow tube consisting of parylene, a lumen with a circular cross section and diameter of 1 µm to 100 µm, a constant wall thickness in a range between 0.1 µm and 100 µm, and a length greater than 30 centimeters, the tube having a lumen, and a residue inside the lumen comprising cyclic ethylene carbonate.

DETAILED DESCRIPTION

Figure 1A:
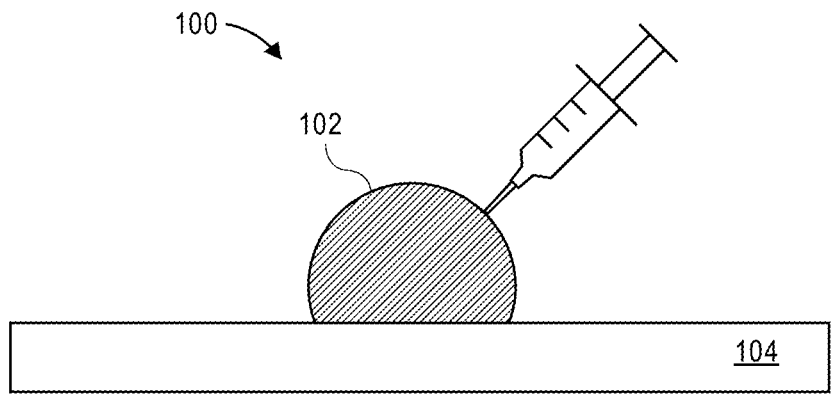
FIG. 1A illustrates a liquid solution in accordance with a manufacturing process embodiment.

Polymer microfibers and/or microcapillaries can be manufactured with diameters as small as several micrometers (µm) and a length as long as meters. In some embodiments, parylene microcapillaries with a minimum inner diameter of 3 µm and a length exceeding 30 cm can be made.

Sacrificial poly(ethylene carbonate) (PEC) fibers are first mechanically pulled in air from a chloroform solution at an optimal speed. Cooling the solution to 0° C. is found to greatly improve fiber uniformity. Hollow capillaries are then made by coating the PEC fibers with parylene and then vacating the sacrificial PEC. The inventors identified a high temperature self-expelling mechanism for molten PEC inside the capillaries. This greatly reduces the removal of the sacrificial fiber to tens of minutes.

Some previous methods rely on diffusion-limited etching which limits the length of the capillaries to a few millimeters. The introduction of a sacrificial polymer of poly (ethylene carbonate) in a fiber drawing step leads to better results. The length is extended from a few millimeters in the prior art to tens of centimeters, an improvement in length of more than 100 times.

Parylene C and other types of parylene (D, N, HT, A, AM) can be used depending on the application.

Applications for the microcapillaries are those that require the manipulation of fluids in the microliter range. For example, printing nozzles for flexible printed circuit boards, biofluid collection needles, or cell-culturing scaffolds. Embodiments can be used alone as or in combination with regenerative cell therapies and bone marrow stimulating techniques.

FIGS. 1A-1F illustrate a manufacturing process at its various steps.

PEC is first dissolved in chloroform to create a liquid solution. A PEC solution can be prepared by dissolving PEC polymer, such as QPAC® 25 poly(ethylene carbonate) available from Empower Materials, Inc. of New Castle, Del., USA, in chloroform at concentrations of 12% by weight, 17%, 20%, 25%, or concentrations in between.

For cases at lower concentration, fibers tend to break up due to excessive capillary thinning prior to solidification. However, if the concentration is too high, the viscosity begins to dominate, causing fiber uniformity to deteriorate. Therefore solutions with PEC polymer mass fractions of 20 wt % are preferred for fiber pulling accordingly.

In experiments, surface viscosity $\eta_0$ and surface tension $\sigma$ of 20 wt % PEC solution were measured independently and provided in Table 1. The mass transfer coefficient h is estimated from pure chloroform.

Anubhar Tripathi, P. Whittingstall, and Gareth H. McKinley, "Using filament stretching rheometry to predict strand formation and 'processability' in adhesives and other non-Newtonian fluids" *Rheologica Acta*, vol. 39, pp. 321-337, 2000 defines processability P.

TABLE 1

| Parameters | 20%, T = 25° C. | 20%, T = 0° C. |
|---|---|---|
| $\eta_0$ | 17.2 Pa-s | 23.8 Pa-s |
| $\sigma$ | 27 mN/m | |
| h | $5.9 \times 10^{-6}$ m/s | $1.4 \times 10^{-7}$ m/s |
| P | $3.8 * 10^{-3}$ | $1.2 \times 10^{-4}$ |

In embodiments, the diameter of the drawn PEC fibers increases with the chloroform evaporation rate and decreases with the pulling speed and total fiber length. The uniformity of the fiber is improved with a lower processability number, which occurs at 0° C. for the 20 wt % PEC solution. Parylene capillaries with an inner diameter as small as 3 µm can be successfully fabricated.

FIG. 1A illustrates the portion of manufacturing process 100 in which liquid solution 102 is dispensed as a drop on glass slide 104 by a syringe pump. The syringe and glass slide can be put inside a temperature-controlled bath if necessary. The drawing process begins immediately after the solution is dispensed by the syringe pump to avoid the influence of chloroform evaporation.

Figure 1B:
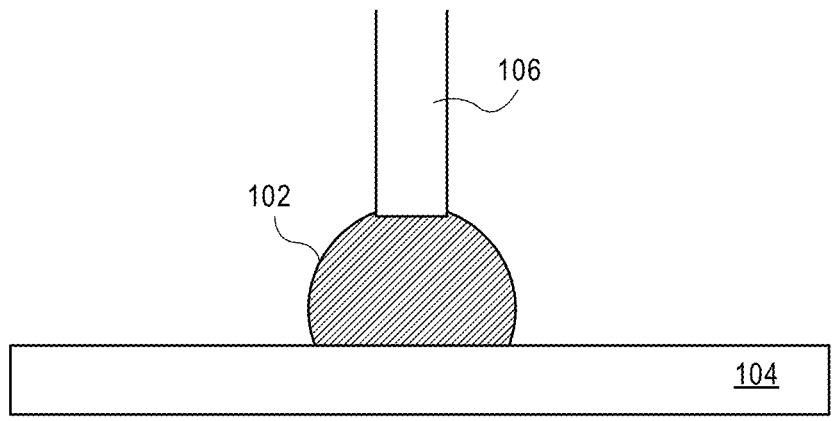
FIG. 1B illustrates contacting a seed to the liquid solution of FIG. 1A.

FIG. 1B shows a glass tube 106, referred to as a "seed," having one of its end points touched to liquid solution 102. In the exemplary embodiment, glass tube 106 has diameter 111 of 762 µm. At that scale, the point of the seed breaks underneath the surface, and surface tension draws a meniscus to the diameter of the glass tube.

Figure 1C:
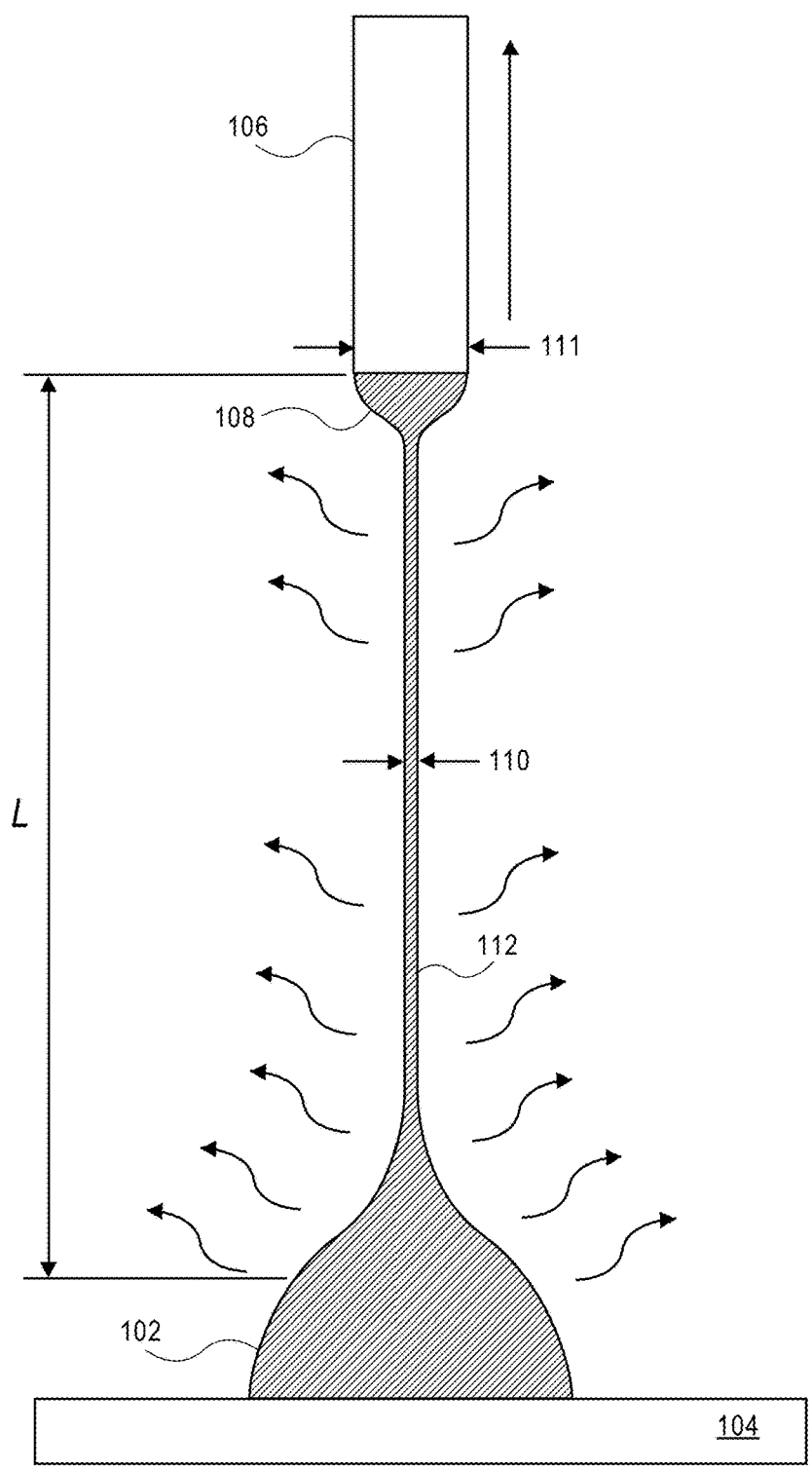
FIG. 1C illustrates drawing a polyethylene carbonate (PEC) fiber with the seed of FIG. 1B.

FIG. 1C shows glass tube 106 being pulled away at a steady and constant velocity from the drop of liquid solution 102. For example, the velocity can be 13 mm/minute to 1100 mm/minute or other velocities.

Surface tension creates a bridge column of liquid between meniscus 108 on glass tube 106 and the drop of liquid solution 102. Evaporation of the chloroform from the chloroform-PEC solution is fastest in the thin column, which has the greatest surface area to volume. As the chloroform leaves the solution, there is an exponential increase of the viscosity of the PEC-chloroform column that is leaving the starting solution. This mechanism also quickly solidifies the mechanical strength and stabilizes the fiber. The liquid bridge column dries into PEC fiber 112 with diameter 110. Temporarily focusing on experimental measurements of this process may be instructive.

Figure 2:
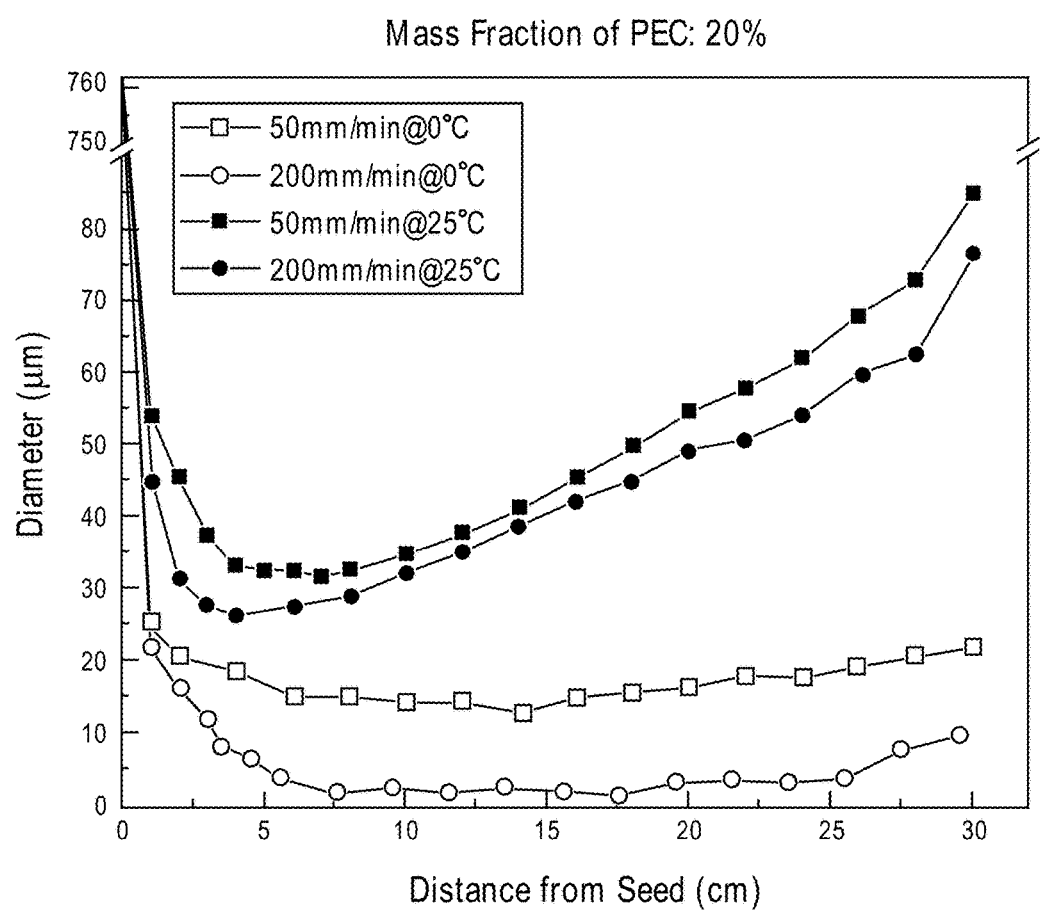
FIG. 2 is a chart of diameter versus distance of seed pulling speed and liquid solution temperature combinations in accordance with embodiments.

FIG. 2 is a chart of experimentally measured diameters versus distances. PEC fibers with diameters ranging from 3 to over 50 µm were successfully fabricated.

Fibers drawn at room temperature (25° C.) show a typical U-shaped diameter versus length profile in the chart. Take the fiber pulled at 50 mm/minute at room temperature (filled in squares in chart). The diameter drops rapidly from 762 µm to 100 µm less than 1 mm from the glass seed, then it drops slowly to the minimum value of 32.7 µm at a distance 5 mm away from the glass seed. After that, it grows slowly, almost at a constant ramping rate, until to the end of the fiber. It is theorized that the constant ramping, tailing effect at 25° C. is due to chloroform evaporation from the PEC solution.

Fibers drawn at 0° C. show little such ramping, tailing effect. Their diameter versus distance curves have flat portions, representing a constant diameter along its length. At 0° C., the evaporation rate of chloroform is greatly reduced so it allows a longer pulling time, while the viscosity does not increase too much. Take the fiber pulled at 200 mm/minute at 0° C. (hollow circles in chart at bottom). Its diameter is 3±1 µm over a length of 16 cm. The diameter grows slightly at 20-25 cm and then ramps up at 25-30 cm.

Lengths greater than 30 mm, 40 mm, 50 mm, 60 mm, 70 mm, 80 mm, 90 mm, and 100 mm are well within reach, while lengths greater than 30 cm, 40 cm, 50 cm, 60 cm, 70 cm, 80 cm, 90 cm, 100 cm, and multiple-meter lengths are envisioned with optimal pulling speeds, PEC-chloroform concentrations, and controlled atmospheres.

These drawing results also show that, at higher processability numbers, the filament remains quite thick and has poor axial uniformity. At lower processability numbers, the diameter of the filament can be reduced and the filament has much larger axial uniformity.

Figure 1D:
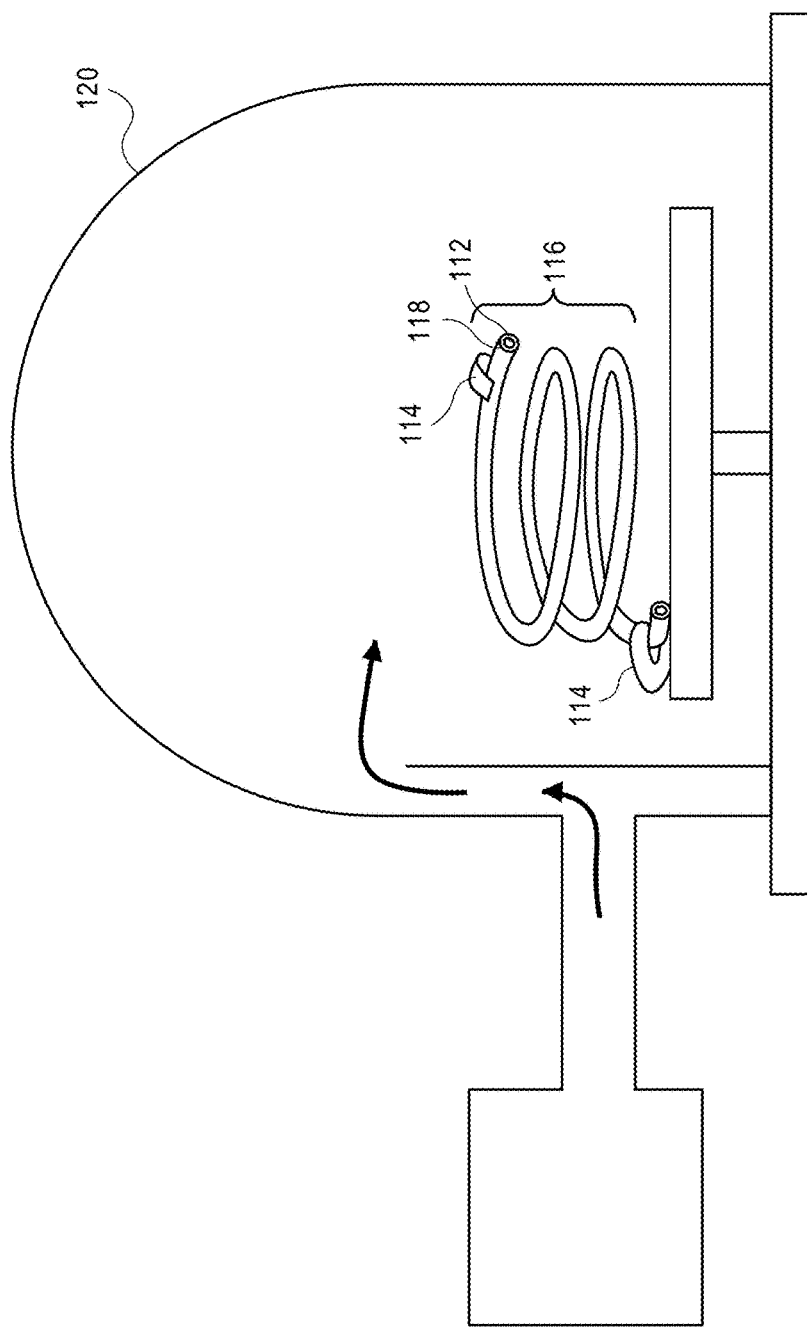
FIG. 1D illustrates a deposition chamber with the drawn fiber from FIG. 1C.

FIG. 1D illustrates PEC fiber 112 having been coiled up in coil 116 and placed in deposition chamber 120. PEC fiber 112 is held in position by clips 114. As an alternative to coiling, the PEC fiber could have been bent back and forth in an S, serpentine pattern or other patterns so that it can fit in the deposition chamber.

Parylene is deposited as coating 118 on PEC fiber 112 to a desired thickness, for example from 0.1 µm to 100 µm. Parylene coats remarkably evenly so that there is a constant wall thickness. Even if the PEC fiber varies somewhat in diameter (e.g., 3±1 µm), the wall thickness will generally be constant, that is radially symmetric and axially unvarying, because of the parylene deposition process. The result is a well-coated PEC fiber.

Figure 1E:
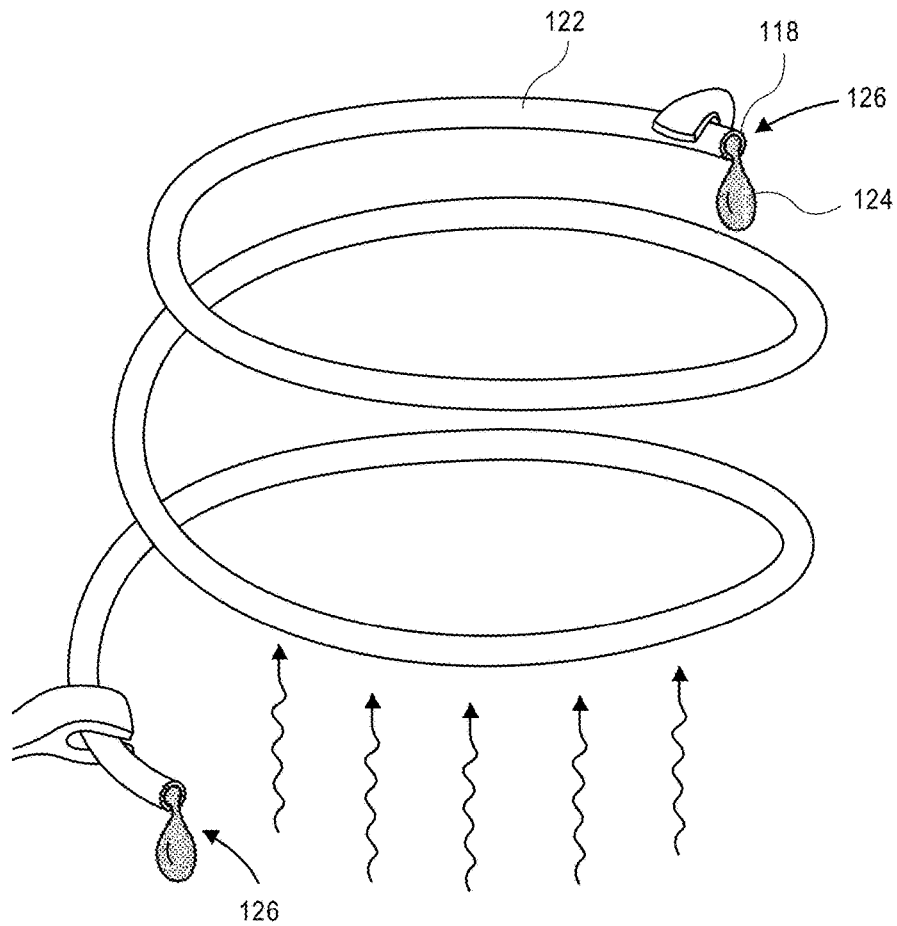
FIG. 1E illustrates heating the coated fiber from FIG. 1D to expel molten PEC.

FIG. 1E illustrates heating the coated fiber. This may be performed in a deposition chamber or elsewhere. As the ends of the fiber may have been coated by parylene, these ends of the coated fiber are snipped away to reveal open ends 126.

While heated above 180° C., the PEC begins to melt and flow out the ends of the coating 118 of parylene as molten PEC 124. The binders in QPAC® 25 poly(ethylene carbonate) thermally decompose starting at 200° C. and almost completely in air at 300° C. It was measured to thermally decompose for these purposes at approximately 250° C. with less than 69 parts per million (ppm) of residue remaining. Manufacturer supplied material data sheets indicate that it decomposes into cyclic ethylene carbonate and carbon dioxide ($CO_2$).

As the PEC farther inside melts and decomposes, the phase change to gaseous carbon dioxide creates an internal pressure within the coated PEC fiber. The gas efficiently pushes the molten PEC outside the capillary from any open end. The result is that all PEC inside, even for an extremely long micro-sized capillary, can be pushed out in a short time. It is therefore not limited by diffusion-through-parylene mechanisms or etching limitations. A minor residue may remain inside the cleared lumen of the resulting hollow parylene capillary 122.

The temperature should not exceed the melting point of the parylene. Melting points of various types of parylene are given in Table 2.

TABLE 2

| Material | Melting Point |
|---|---|
| parylene C | 290° C. |
| parylene D | 380° C. |
| parylene N | 420° C. |
| parylene F | 435° C. |
| parylene HT | >500° C. |

Figure 1F:
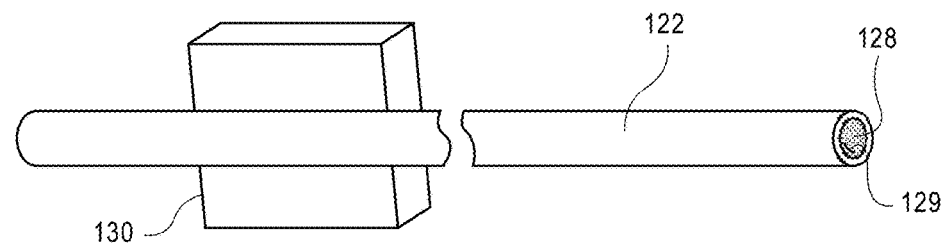
FIG. 1F illustrates a finished capillary with residue left from the process in FIG. 1E.

FIG. 1F illustrates hollow parylene capillary 122. Capillary 122 has lumen 128 with a small amount of cyclic ethylene carbonate residue 129 within.

Capillary 122 is stretched over form 130. It can be heated above 200° C. in order to mechanically relax and re-form into a desired shape. In the exemplary embodiment, the shape is a straight line. In other embodiments, the shape may include curves, coils, acute and obtuse angles, or other contours necessary for a desired application.

Figure 3:
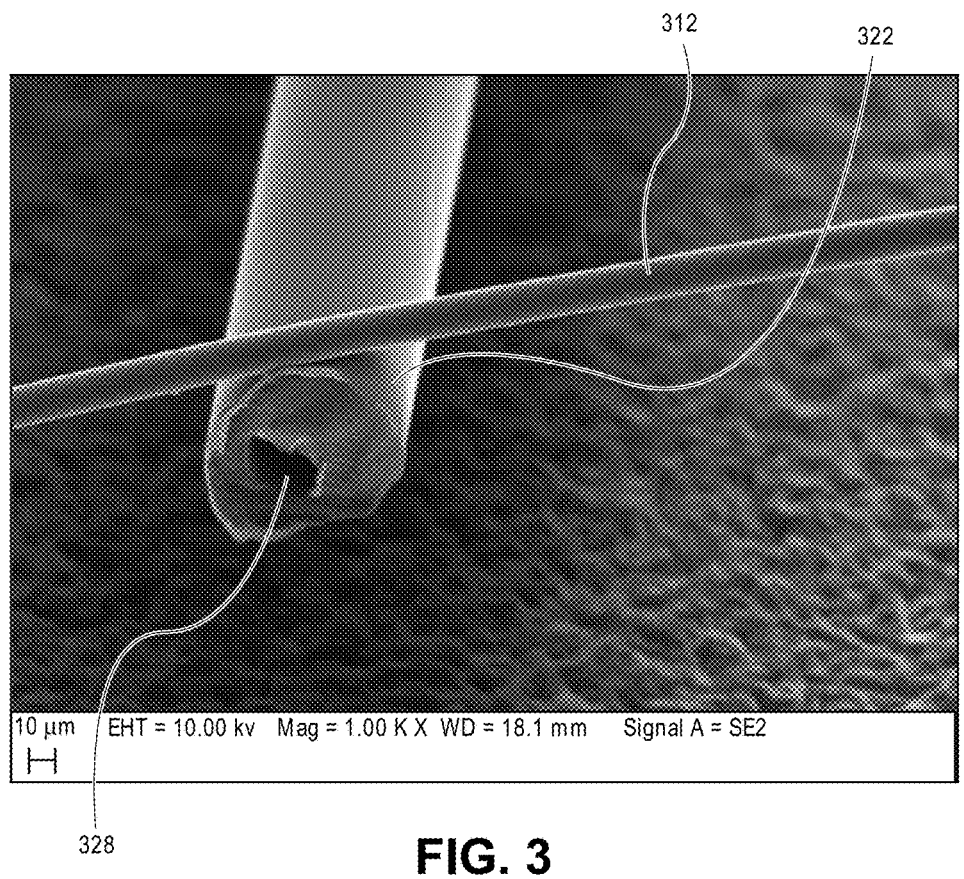
FIG. 3 is a micrograph of a capillary and a sacrificial fiber in accordance with an embodiment.

FIG. 3 is a scanning electron microscope (SEM) picture of PEC fiber 312, which cut across the picture horizontally, and parylene microcapillary 322, which extends vertically in the picture. The particular PEC fiber 312 shown in the picture was not used to manufacture the particular parylene microcapillary 322 shown. The PEC fiber that was used for manufacturing microcapillary 322 was melted away as part of its manufacturing process.

It is apparent from the picture that PEC fiber 312 has a uniform diameter with few defects. PEC fibers with diameters ranging from 3 to over 50 µm are readily producible as well as smaller and larger fibers, such as those from 1 to 100 µm.

Is also apparent from the picture that parylene microcapillary 322 has a uniform outer diameter. What may not be apparent from the picture is that the inner diameter of lumen 329 within microcapillary 322 is uniform along its length and symmetric with respect to the outer diameter. The walls around the lumen are uniform and of constant wall thickness. For the picture, cutting such a small capillary cleanly was exceedingly difficult. In the picture, some of the parylene that was cut obscures the top right of the hole, and the perspective is such that the uniform and symmetric wall thickness may not be readily apparent.

Figures 4A, 4B, 4C:
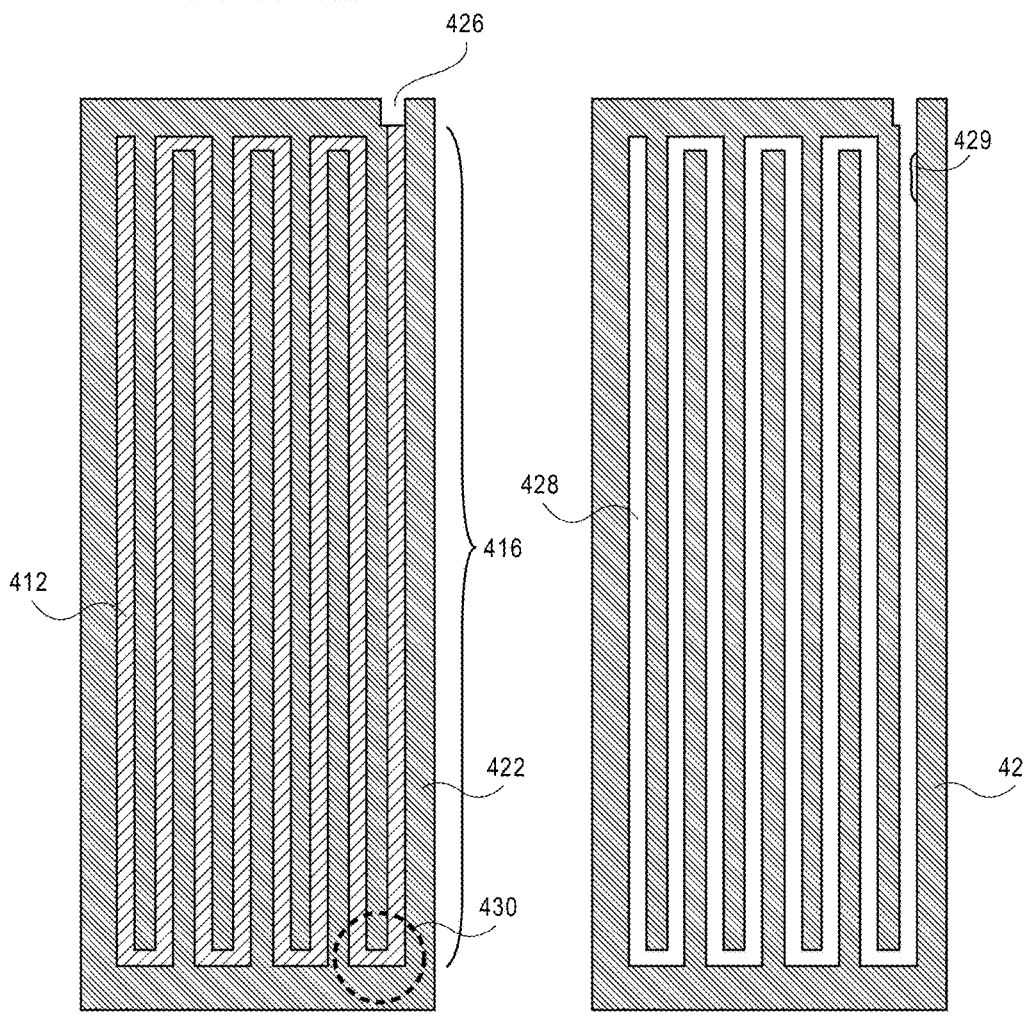
FIG. 4A is a top view of a serpentine fiber in accordance with a manufacturing process embodiment.
FIG. 4B is a cross section view of the fiber of FIG. 4A.
FIG. 4C is a top view of a serpentine capillary produced from the serpentine fiber of FIG. 4A.

FIGS. 4A-4C illustrate an alternative manufacturing process at its various steps for a 64 mm long microchannel apparatus 422 fabricated on a silicon substrate.

A 3 µm thick layer of parylene HT was deposited on a silicon wafer, followed by spin coating of PEC in N-Methyl-2-pyrrolidone (NMP) solution to a resulting 6 µm thickness.

After photolithography and plasma etching of the PEC into serpentine shape 416 with U-shaped ends 430, another layer of 6 µm thick parylene HT was deposited to complete the microchannel PEC fiber 412. Due to the nature of etching, the PEC will have a rectangular cross section. With another photolithography, opening 426 is made using oxygen plasma on one end of the designed serpentine microchannels.

The parylene-PEC-parylene structure is set on a hot plate at 260° C., past the melting and decomposition temperatures of the PEC. The PEC melts and at least partially decomposes into carbon dioxide. As before, the gaseous carbon dioxide pushes the molten PEC of end 426. In this experiment after only 10 minutes, the evacuation of PEC was close to completion and the microchannel 428 visibly clean. There remains minor residue 429, not illustrated to scale, of cyclic ethylene carbonate.

Figure 5:
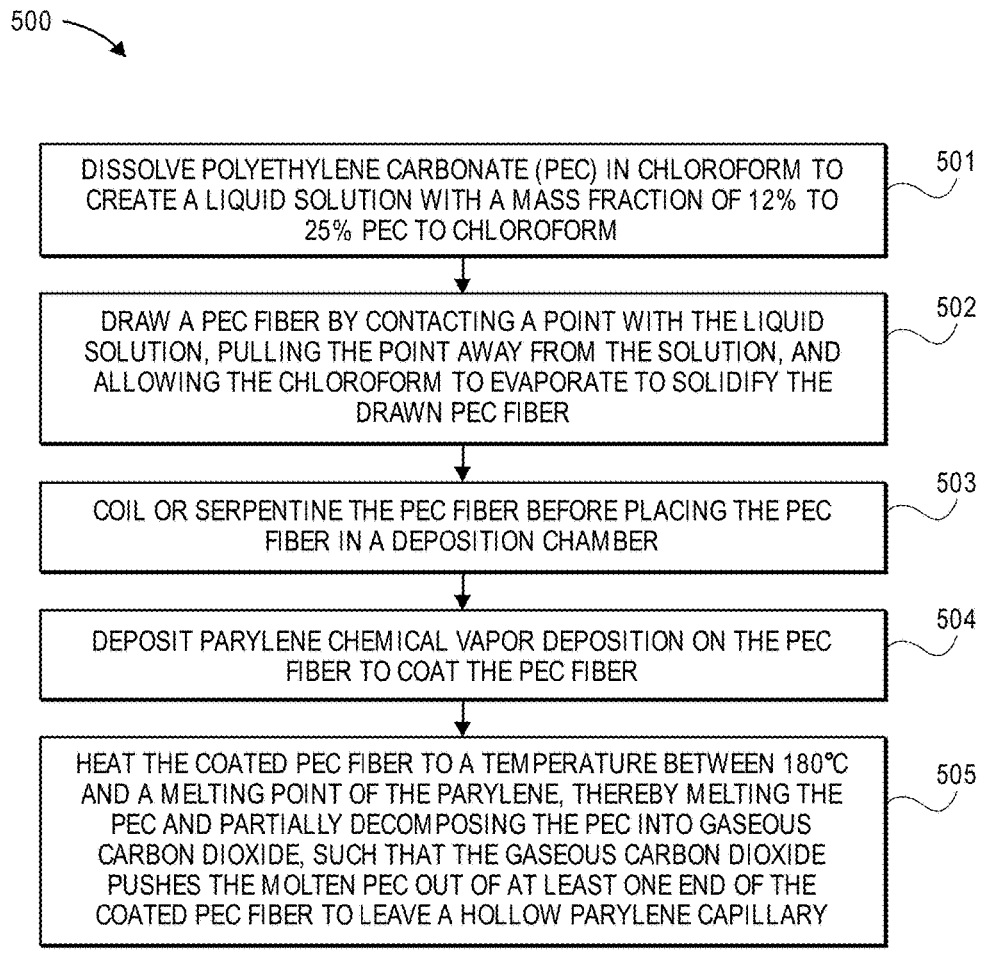
FIG. 5 is a flowchart illustrating a process in accordance with an embodiment.

FIG. 5 is a flowchart illustrating process 500 in accordance with an embodiment. In operation 501, polyethylene carbonate (PEC) is dissolved in chloroform to create a liquid solution with a mass fraction of 12% to 25% PEC to chloroform. In operation 502, a PEC fiber is drawn by contacting a point, such as an end of a glass tube, with the liquid solution, pulling the point away from the solution droplet, and allowing the chloroform to evaporate to solidify the drawn PEC fiber. In operation 503, the PEC fiber is coiled or serpentine before placing the PEC fiber in a deposition chamber. In operation 504, parylene is chemical vapor deposited (CVD) on the PEC fiber in order to coat the PEC fiber. In operation 505, the coated PEC fiber is heated to a temperature between 180° C. and a melting point of the parylene, thereby melting the PEC and partially compositing the PEC into gaseous carbon dioxide, such that the gaseous carbon dioxide pushes the molten PEC out of at least one end of the coated PEC fiber to leave a hollow parylene capillary.

Figure 6:
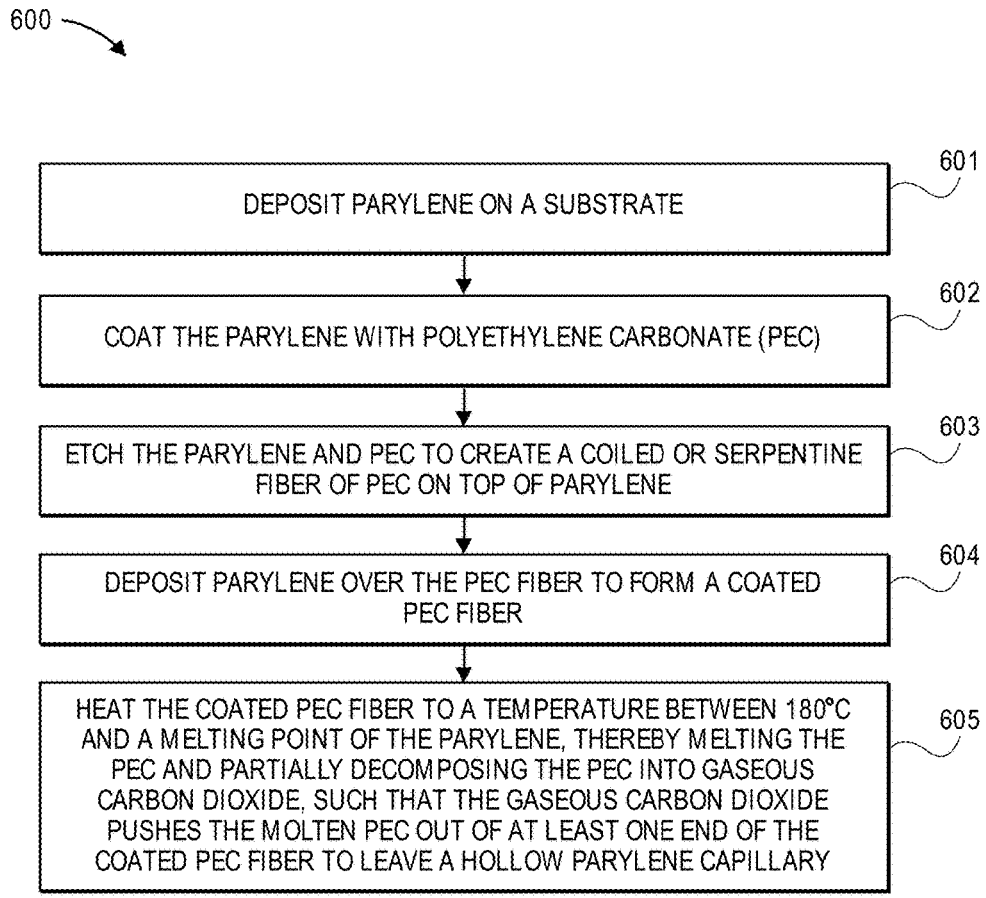
FIG. 6 is a flowchart illustrating a process in accordance with an embodiment.

FIG. 6 is a flowchart illustrating process 600 in accordance with an embodiment. In operation 601, parylene is deposited on a substrate. In operation 602, the parylene is coated with polyethylene carbonate (PEC). In operation 603, the PEC is etched to create a coiled or serpentine fiber of PEC on top of parylene. In operation 604, more parylene is deposited over the PEC fiber to form a coated PEC fiber. In operation 605, the coated PEC fiber is heated to a temperature between 180° C. and a melting point of the parylene, thereby melting the PEC and partially decomposing the PEC into gaseous carbon dioxide, such that the gaseous carbon dioxide pushes the molten PEC out of at least one end of the coated PEC fiber to leave a hollow parylene capillary.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. "About" in reference to a temperature or other engineering units includes measurements or settings that are within ±1%, ±2%, ±5%, ±10%, or other tolerances of the specified engineering units as known in the art.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method of manufacturing a biocompatible capillary, the method comprising:

dissolving polyethylene carbonate (PEC) in chloroform to create a liquid solution with a mass fraction of 12% to 25% PEC to chloroform;

drawing a PEC fiber by contacting a point with the liquid solution, pulling the point away from the solution, and allowing the chloroform to evaporate to solidify the drawn PEC fiber;

depositing parylene by chemical vapor deposition on the PEC fiber to coat the PEC fiber;

heating the coated PEC fiber to a temperature between 180° C. and a melting point of the parylene, thereby melting the PEC and partially decomposing the PEC into gaseous carbon dioxide, such that the gaseous carbon dioxide pushes the molten PEC out of at least one end of the coated PEC fiber to leave a hollow parylene capillary.

2. The method of claim 1 further comprising:
cooling the solution to 0° C. before the pulling.

3. The method of claim 1 wherein the coated PEC fiber is heated to a temperature between 180° C. and 260° C.

4. The method of claim 1 further comprising:
coiling or serpentining the PEC fiber before placing the PEC fiber in a deposition chamber for the deposition.

5. The method of claim 1 further comprising:
stretching the hollow parylene capillary over a form; and
heating the stretched hollow parylene capillary to a temperature above 200° C. in order to mechanically relax and re-form the hollow parylene capillary.

6. The method of claim 1 wherein the depositing results in a parylene wall thickness between 0.1 µm and 100 µm.

7. The method of claim 1 wherein the parylene is selected from the group consisting of parylene N, parylene C, parylene D, parylene HT, parylene AF-4, and parylene F.

8. The method of claim 1 wherein the pulling of the point is performed at a constant velocity.

9. The method of claim 8 wherein the point is an end of a cylinder.

10. The method of claim 9 wherein the cylinder is a glass tube 762 µm in diameter.

11. The method of claim 8 wherein the constant velocity is between 13 millimeters (mm) per minute to 1100 mm/minute.

12. The method of claim 1 wherein the PEC fiber is drawn to a length greater than 50 millimeters (mm).

13. The method of claim 12 wherein the PEC fiber is drawn to a length greater than 300 mm.

14. A method of manufacturing a biocompatible capillary, the method comprising:
depositing parylene on a substrate;
coating the parylene with polyethylene carbonate (PEC);
etching the PEC to create a coiled or serpentine fiber of PEC on top of parylene;
depositing parylene over the PEC fiber to form a coated PEC fiber;
heating the coated PEC fiber to a temperature between 180° C. and a melting point of the parylene, thereby melting the PEC and partially decomposing the PEC into gaseous carbon dioxide, such that the gaseous carbon dioxide pushes the molten PEC out of at least one end of the coated PEC fiber to leave a hollow parylene capillary;
stretching the hollow parylene capillary over a form; and
heating the stretched hollow parylene capillary to a temperature above 200° C. in order to mechanically relax and re-form the hollow parylene capillary.

15. The method of claim 14 wherein the coated PEC fiber is heated to a temperature between 180° C. and 260° C.

16. The method of claim 14 wherein the etching creates a serpentine fiber of PEC, wherein the hollow parylene capillary has periodic U-shaped sections along its length.

* * * * *